United States Patent [19]

Kersten et al.

[11] Patent Number: 4,871,961
[45] Date of Patent: Oct. 3, 1989

[54] METHOD OF CONTROLLING THE SUPPLY OF POWER TO ELECTRICAL LOADS WITH A MINIMUM OF SWITCHING SURGES

[75] Inventors: Reinhard Kersten; Karl J. Kühlmorgen; Egbert Kuhl, all of Aachen, Fed. Rep. of Germany

[73] Assignee: U.S. Philips Corporation, New York, N.Y.

[21] Appl. No.: 225,339

[22] Filed: Jul. 28, 1988

[30] Foreign Application Priority Data

Aug. 10, 1987 [DE] Fed. Rep. of Germany ....... 3726535

[51] Int. Cl.⁴ .............................................. G05F 1/44
[52] U.S. Cl. .................... 323/267; 323/271; 323/322; 323/350; 323/351; 307/40
[58] Field of Search ............... 323/267, 268, 271, 272, 323/320, 322, 324, 350, 351

[56] References Cited

U.S. PATENT DOCUMENTS

| | | | |
|---|---|---|---|
| 4,175,249 | 11/1979 | Gruber | 323/271 |
| 4,282,422 | 8/1981 | Payne et al. | 307/40 |
| 4,430,609 | 2/1984 | Van Kessel et al. | 323/350 |
| 4,779,038 | 10/1988 | Eckerfeld | 323/322 |

FOREIGN PATENT DOCUMENTS

| | | |
|---|---|---|
| 0162620 | 11/1985 | European Pat. Off. . |
| 1801404 | 6/1970 | Fed. Rep. of Germany . |
| 3003451 | 8/1980 | Fed. Rep. of Germany . |
| 3426046 | 1/1986 | Fed. Rep. of Germany . |

Primary Examiner—Peter S. Wong
Attorney, Agent, or Firm—Bernard Franzblau

[57] ABSTRACT

A method of controlling the supply of power to electrical loads with a minimum of switching surges in which the loads are each electrically subdivided into at least two equal subloads. The subloads of each load can be connected each time arbitrarily in at least three main power stages to an A.C. mains. In order to obtain a minimum switching surge effect on the A.C. mains while providing finer power control six additional intermediate power stages are provided, in which starting from one of the three main power stages, the subloads are switched in a continuously repeated cycle of six A.C. half waves in the first intermediate power stages during the third and sixth half waves in each cycle and in the second intermediate power stages additionally during the second and fifth half waves each time to the next lower main power stage, which in the case of a series arrangement is that in which the power consumption is switched off.

22 Claims, 3 Drawing Sheets

METHOD OF CONTROLLING THE SUPPLY OF POWER TO ELECTRICAL LOADS WITH A MINIMUM OF SWITCHING SURGES

BACKGROUND OF THE INVENTION

This invention relates to a method of controlling the supply of power to electrical loads with a minimum of switching surges, more particularly heating loads which are each electrically subdivided into at least two equal subloads, in which the subloads of each load can be connected arbitrarily in at least three main power stages in series arrangement alternately individually or in parallel arrangement to an A.C. mains.

For the control of power supplied to electrical loads having a high power consumption, for example furnace plates of an electric furnace, it is frequently desirable to make available a maximum number of finely graded power stages. For this purpose, it is known, for example, for furnace plates to provide a so-called three-point control, in which several windings are arranged in parallel, which admit different power consumptions. Such an arrangement is very complicated, however, and cannot be used economically, especially for many power stages.

EP No. A2 0 162 620 discloses the method mentioned in the opening paragraph, in which each load is subdivided into several subloads, that is to say, for example, that a heating winding is subdivided into several subwindings in such a manner that the subwindings can be connected to the supply voltage mains in series arrangement, in series-parallel or in parallel arrangement. If then each heating load is subdivided into two subloads, a main power stage is obtained for each heating load. If the subloads are connected to the mains in parallel arrangement, they have the maximum current consumption. The power stage having the smallest power consumption is the series arrangement, in which both windings are connected in the mains in series arrangement. In such a method of controlling the power supply, several main power stages are thus possible with heating loads subdivided into two subloads. Such a power gradation is frequently not sufficient, however, for some applications, for example for furnace plates of an electric furnace.

For the control of power with finer gradation of the power consumption, it would be possible to switch to and fro between the main power stages or to switch on the main power stages each time only for given periods. However, due to the high power consumption, the problem of mains polution arises. When switching the loads on and off, in fact switching surges are produced which give rise to corresponding mains voltage fluctuations. The eye reacts very sensitively to such mains voltage fluctuations, especially in a frequency range below 25 Hz. Therefore, for corresponding apparatuses there are regulations which limit the value of the switching surges and thus the mains pollutions caused thereby. A relevant regulation is the IEC standard 555 "Disturbances in supply system caused by household appliances and similar electrical equipment". This standard defines the content of higher waves frequency (above 50 Hz) and mains voltage fluctuations below 50 Hz which may be allowed by electrical loads connected to a mains. Moreover, a very small effect of the net direct current is prescribed.

In practice, the problem arises that for the maintenance of such standards especially for loads above 500 W, shorter switching times between the aforementioned main power stages are, practically speaking, no longer possible because then the standard is no longer maintained. It should be noted that the mains voltage fluctuations caused be devices having a high power consumption are frequently designated as "flicker".

With the power stages described in the aforementioned EP-No. A2 0 162 620, the IEC standard cannot be maintained because the effects of switching surges are too large when switching between different stages and moreover an inadmissible net direct current effect occurs.

DE-No. OS 3426046 further discloses an electrical continuous heater in which two power stages are provided. The lower power stage is constituted by a load consisting of two parallel-connected heating resistors which are connected to one phase of a three-phase current mains. The higher power stage is constituted by heating resistors which are arranged in a star circuit and are connected to the phases of the three-phase current mains. Therefore, two main power stages are realized by more than two subloads. The higher power stage can be realized not by an A.C. mains, but only by a three-phase current mains.

SUMMARY OF THE INVENTION

An object of the invention is to provide a method of controlling the supply of power to electrical loads with a minimum of switching surges, especially loads having a high power consumption, which in addition to the known main power stages comprises further fine power stages, and which maintains the relevant international standards for switching surge effects and net D.C. effects of A.C. mains equipment.

According to the invention, this object is achieved in that for a finer power supply control six intermediate power stages are provided in which, starting from one of the three main power stages, in a continuously repeated cycle of six A.C. half waves, a first intermediate power stage is provided in which, during the third and sixth half waves in each cycle, the system is switched to the next lower power stage. Furthermore, a second intermediate power stage is provided which, in addition during the second and fifth half waves, the system is switched to the next-lower main stage, which in the case of a series arrangement is condition were the power consumption is switched off.

According to this method, in addition to the main power stages further intermediate power stages are provided. Further, a cycle is provided comprising six A.C. half waves. Such a cycle is continuously repeated. With a cycle length of six half waves, no net D.C. effect is admitted over the length of a cycle.

For loads each comprising two subloads which can be connected in three main power stages to an A.C. mains, a cycle of six A.C. half waves is provided. In order to maintain the relevant standards for a maximum switching surge, effect in first intermediate power stages the system is switched each time during the third and sixth half waves in each cycle to one main power stage lower. Additionally, second intermediate power stages are provided in which, in addition to the third and sixth half waves, the system is also switched each time during the second and fifth half waves to the next lower main power stage. Therefore, starting from each of the three main powe stages, there are each time two intermediate stages so that six intermediate power stages are present in all.

Therefore, starting from one of the three main power stages, the loads are switched during several fixed A.C. half waves in each cycle to one main power stage lower. If, for example, starting from the parallel arrangement of two subloads, a further intermediate power stage is provided in which, for example in each third and sixth A.C. half wave of each cycle, the loads are switched to one main power stage lower. This means in the present example that during each third and sixth A.C. half wave in each cycle of the parallel arrangement, the system is switched over so that alternately individual ones of the subloads are switched on. Therefore, during all A.C. half waves in each cycle the arrangement is switched on, but during each third A.C. half wave either the first subload or the second subload, or during each sixth A.C. half wave either the second subload or the first subload of the heating load, is switched on alone. Starting from this example, further intermediate power stages can be provided. In this example, for the second intermediate power stage, which is based on the main power stage of the parallel arrangement of the two loads, the system would be switched additionally also in each second and fifth half wave to the next lower main power stage. This means in the present example that the two subloads are switched on alternately. A cycle of this second intermediate power stage is as follows, during the second and fifth half waves power is switched to the first subload and during the third and sixth half waves to the second subload and during the first and fourth half waves of each cycle the two loads are connected in parallel to the mains. Since a cycle consists of six A.C. half waves, in the manner described above at most two intermediate power stages are arranged between two main power stages, which intermediate stages do not give rise to a net D.C. effect on the mains in the case of equal subloads.

Of couse, in the manner described above, further intermediate power stages may be provided between the remaining main power stages. For example, starting from the main power stage in which the subloads of a load are alternately switched on, the system is switched back to the main power stage series arrangement during a few A.C. half waves in the cycle. For the series arrangement of the two sub-loads, the two intermediate power stages based on this main power stage are obtained as follows; in the first intermediate power stage the system is switched to zero power consumption during the third and sixth half waves and in there the second intermediate power stage it is additionally switched to zero power consumption during each second and fifth half wave in each cycle. In the present example, in addition to the three main power stages there are consequently six intermediate power stages in all.

By the use of the described method, nine power stages in all are thus obtained along with a minimum effect of switching surges for the intermediate power stages. It is a special advantage of the method that the frequency range in which a residual effect of switching surges is obtained can be freely chosen so that switching occurs each time within valid standards. The changeover of individual half waves permits the effect of switching surges in an uncritical frequency range. This method moreover has the advantage that it can be carried out by means of simply constructed arrangements. More particularly, no specific arrangements are required for the mechanical construction of the heating loads; solely at least two subloads must be present per load. Therefore, an economical construction for the arrangement is obtained.

It should be noted that DE-No. AS 1801404 or DE-No. OS 3003451 each discloses a circuit arrangement for controlling power supply, in which in the highest power stage all the A.C. half waves of a cycle are connected to a load. For lower power stages, A.C. half waves are switched off. With this circuit arrangement, no load can therefore be controlled which comprises at least two subloads. Therefore, for example, the realization of an intermediate power stage based on a main power stage of the parallel arrangement is not possible.

According to a further embodiment of the invention, it is ensured that for switching from a first to a second higher power stage based on the first power stage, successively and in increasing order, each time the next higher power stage is switched on for the duration of at least one cycle until the second power stage is reached.

The method also permits of changing over between different power stages with smaller effects of switching surges on the mains, which stages may be both main power stages and intermediate power stages. For this purpose, starting from the first power stage, the system is switched in such a manner to a second higher power stage that first the next higher power stage lying above the first power stage is switched on. This takes place for the duration of at least one cycle. Subsequently, starting from this power stage, again the next higher stage is switched on i.e. also for the duration of at least one cycle. Thus, the procedure is continued until the second power stage to be switched on is reached. Also with the power stage thus switched on for the duration of at least one cycle and arranged between the first and the second power stage, both main power stages and intermediate power stages may be involved. If during the changeover switching proceeds in this manner, only slightly higher effects of switching surges on the mains are obtained than in the case in which one of the power stages is permanently switched on.

According to a further embodiment of the invention it is ensured that for switching to a second lower power stage the switching proceeds in a corresponding manner with a decreasing order of the power stages. If the second power stage to be switched on has a lower power consumption than the first power stage, switching advantageously proceeds in a similar manner, but in decreasing order of the power stages. Also in this case it again holds that all the power stages located between the first and the second power stage are switched on for the duration of at least one cycle.

According to a further embodiment of the invention, it is ensured that, when switching the subloads to an arbitrary power stage, the system is first switched for the duration of at least one cycle to the lowest intermediate power stage.

In order that, also when switchng to an arbitrary power stage, a minimum switching surge effect is attained, after the process of switching on the power stage, the system is first switched to the lowest intermediate power stage available. This takes place for the duration of at least one cycle. Subsequently, the preselected power stage is switched on, which may again be a main as well as an intermediate power stage. When the lowest intermediate power stage is switched on before the selected power stage, a considerably reduced swtiching surge effect on the mains is obtained when switching-on higher powers.

According to a further embodiment of the invention, it is ensured that further intermediate gradations of the power consumption are provided by switching to and fro between two adjacent power stages for the duration of whole multitples of a cycle.

For an even further refined power gradation, the method provides the possibility of switching to and from between two adjacent power stages for the duration of whole multiples of a cycle. Thus, further power stages are obtained for which the switching surge effect on the mains is hardly higher.

According to a further embodiment of the invention, it is ensured that further power stages are provided below the smallest intermediate power stage by switching to and fro between this intermediate stage and the switched-off power consumption for the duration of whole multiples of a cycle.

In certain applications, it may be desirable to provide further power stages below the smallest intermediate stage according to the invention. Therefore, there is the possibility of switching to and fro between the smallest intermediate power stage and the switched-off power consumption for the duration of whole multiples of a cycle. It is then also possible to make the number of cycles for which the smallest intermediate stage is switched on different from the number of cycles in which the power consumption is zero. For example, for the duration of a cycle the smallest intermediate power stage may be switched on and for the duration of two cycles the power consumption may be switched off. The number of cycles is each time further variable so that theoretically an arbitrary number of further power stages can be provided below the smallest intermediate power stage.

Especially for loads using as subloads halogen lamps as they are increasingly provided in electric furnaces, problems arise with the switching surge effect because the tungsten helices of such halogen lamps have a lower resistance in the cold state than in the hot state. This means that for such loads particularly high switching surge effects are obtained when switching on the loads. More particularly for these loads, the method according to the invention has great advantages because it make possible, even for halogen lamps having, for example, a power consumption of 80 W each, the control of power with a fine gradation.

Moreover, the method described here provides for an only slightly glimmering light impression because the switching variations within the cycles described here are effected sufficiently rapidly.

According to a further embodiment of the invention, it is ensured that during operation of two or more loads, whose subloads are switched to intermediate power stages, the cycle of the second load is shifted in time with respect to the cycle of the first load by a duration of two half waves if the first load is switched to one of the first intermediate power stages and that its cycle is shifted by the duration of a half wave if it is switched to one of the second intermediate power stages.

With such a shift of the second load with respect to the first load, an advantage is obtained in that those half waves in the respective cycles of the two loads during which the loads have a comparatively high power consumption do not coincide in time, but are shifted with respect to each other by at least one half wave. Thus, during operation of two or more loads, a comparatively uniform power extraction from the mains is obtained.

The invention further relates to a cooking apparatus using light as a heat source and comprising at least one heating load composed of two halogen lamps provided as subloads, which constitute with switches a bridge circuit. A control unit also is provided which controls the switches such that the subloads can be arbitrarily over at least six A.C. half waves in three main power stages in series arrangement, alternately individually or in parallel arrangement to an A.C. mains. It is then ensured that the control unit controls the switches in such a manner that, in addition, the subloads can be switched arbitrarily in six intermediate power stages while, starting from oen of the three main power stages, the system switched in a continuously repeated cycle of six A.C. half waves in the first intermediate power stages during the third and sixth half waves in each cycle and in the second intermediate power stages additionally during the second and fifth half waves each time to the next lower main power stage, which in the case of the series arrangement is the condition where power is switched-off. As switches, use may be made of triacs.

BRIEF DESCRIPTION OF THE DRAWING

In order that the invention may be readily carried out, it will now be described more fully, by way of example, with reference to the accompanying drawing, in which.

DESCRIPTION OF THE PREFERRED EMBODIMENTS

Figure 1:
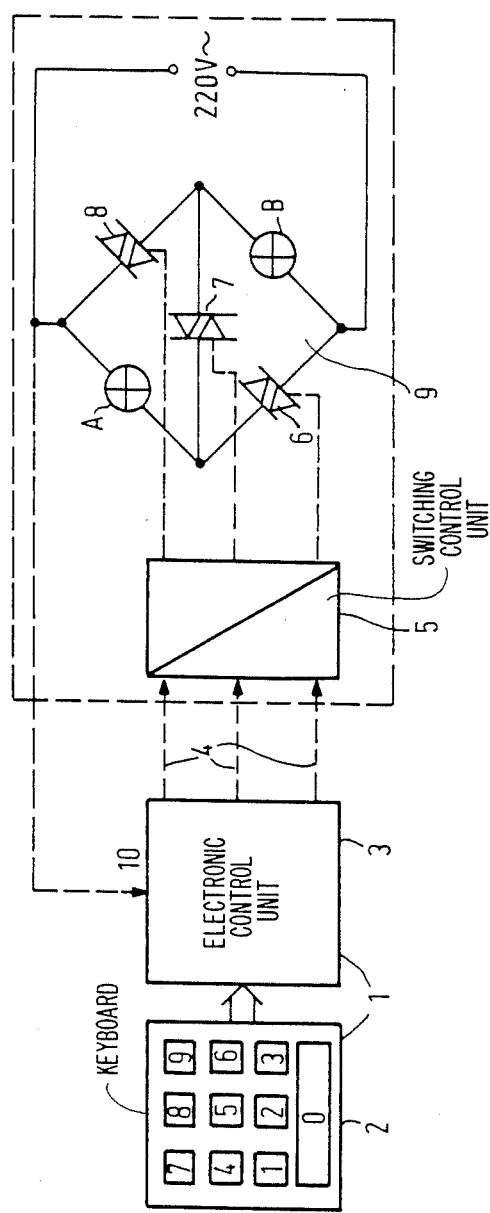
FIG. 1 shows an arrangement suitable for carrying out the method and comprising a load having two subloads.

The arrangement shown in FIG. 1 for carrying out the method of controlling the supply of power to electrical loads with a minimum of switching surges has a control unit 1, which is subdivided into a supply keyboard 2 and an electronic control unit 3. The electronic control unit 3 will generally comprise a microprocessor arrangement. From the control unit 3, three control leads 4 extend to a switching unit 5, which comprises opto-couplers (not shown further in the Figure), which receive control signals from the control unit 3 through the leads 4. Triac control elements, not shown in the Figures, also are present in the control unit 5. Such a circuit comprising an optocoupler and a triac control element is described in the magazine "Siemens Components", Vol. 18 (1900, part 2, p. 69, FIG. 12). These triac control elements control three triacs 6, 7 and 8 present in a bridge circuit 9. The triac 6 is arranged in a bridge branch in series with a load A. The triac 8 is arranged in a second bridge branch in series with a load B. The centres of the two branches are interconnected through a triac 7, which permits the series arrangement of the loads A and B. The junction point between the load A and the triac 8 on the one hand and the junction point btween the triac 6 and the load B on the other hand are connected to an alternating voltage of 220 V.

The two loads A and B represent subloads of a common electrical load. The subloads are halogen lamps which are arranged in a cooking apparatus using light as a heat source. The triacs 6, 7 and 8 and the associated control means comprising the control unit 1 and the control element 5 serve to drive the triacs 6, 7 and 8. With a suitable drive of these triacs, the three main power stages possible with the present load subdivided into two subloads can be switched. If all triacs are switched to the non-conducting state, the loads are switched off. If only the triac 6 is switched to the conducting state, the load A is connected individually to the mains voltage (220 V). If only the triac 8 is switched to the conducting state, the subload B is connected to the mains. If the triac 7 is switched to the conductive state, the loads A and B are connected in series to the mains. If both the triac 6 and the triac 8 are switched to the conducting state, the loads A and B are connected in parallel to the mains. By suitable drive of the three triacs 6, 7 and 8, the subloads A and B can therefore be switched in a suitable manner to the three main power stages.

By means of the arrangement shown diagrammatically in FIG. 1, however, in addition the intermediate power stages provided according to the method can also be switched. To this end, the 220 V mains voltage is supplied to an input 10 of the control unit 20 so that the control unit 3 can identify the A.C. half waves of the mains.

Figure 2:
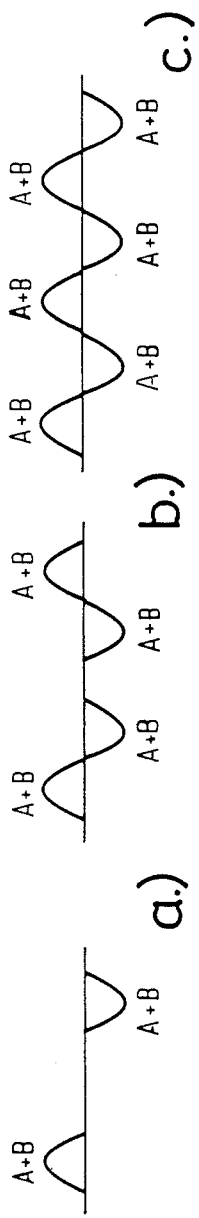
FIGS. 2a to j show switching cycles for the control of the power supply according to the method, FIGS. 3k and l show two switching cycles for simultaneous operation of two loads.
Figure 2:
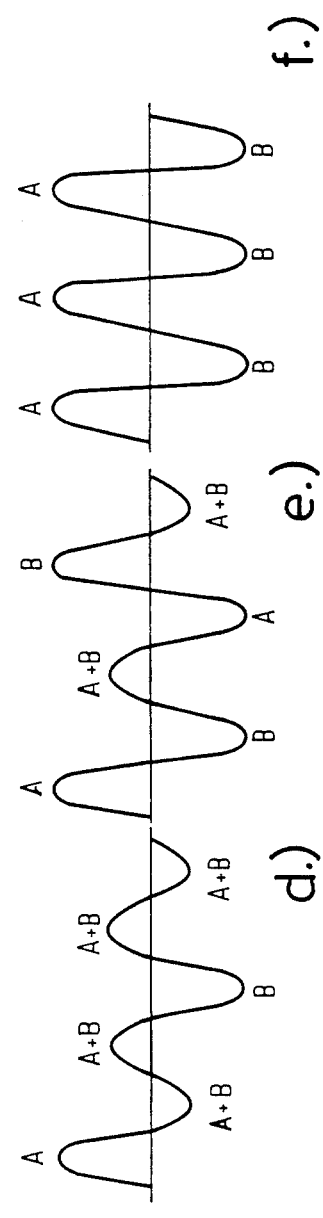
Figure 2:
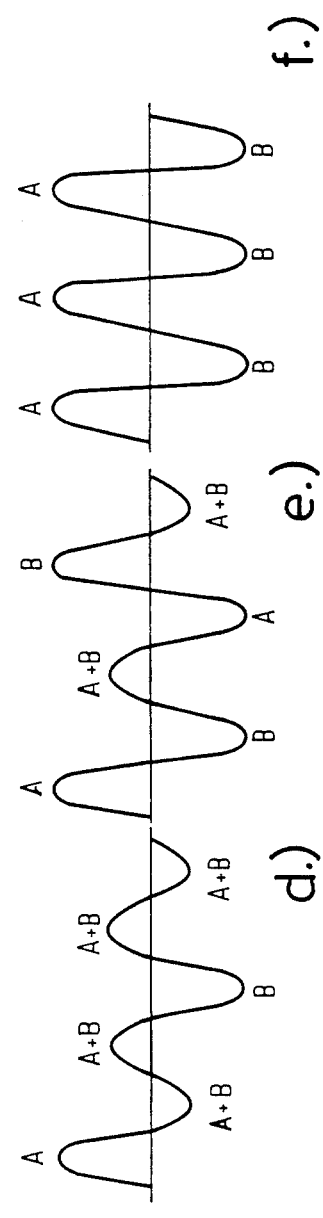
Figure 2:
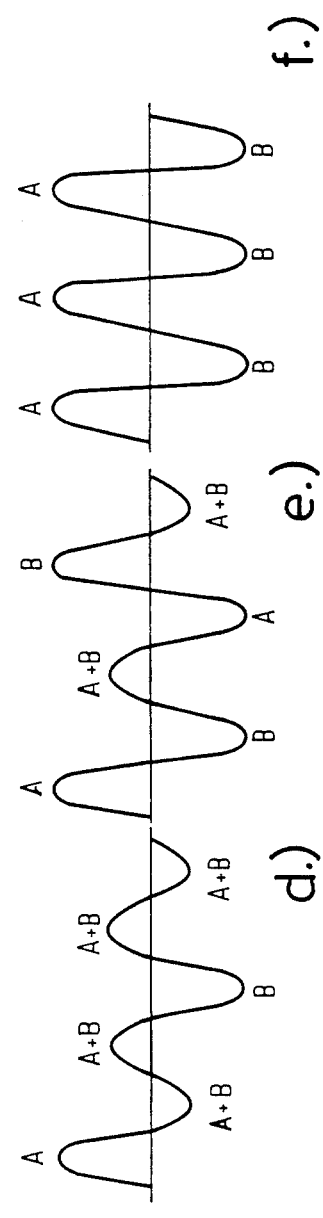
Figure 2:
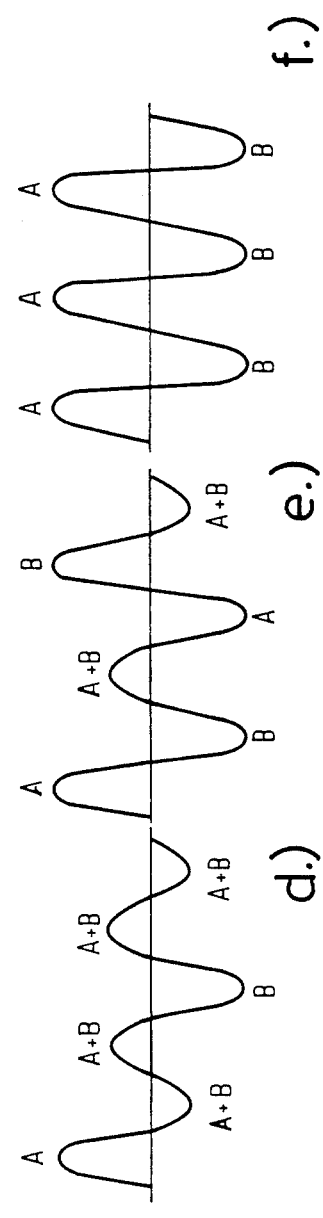
Figure 2:
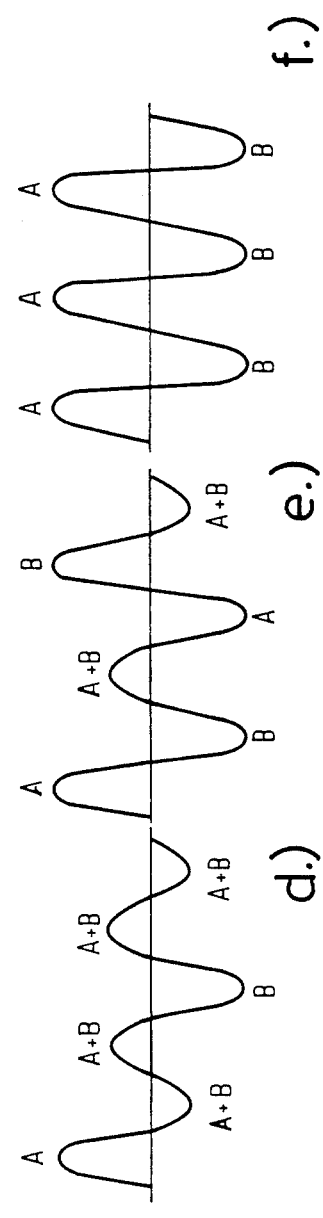
Figure 2:
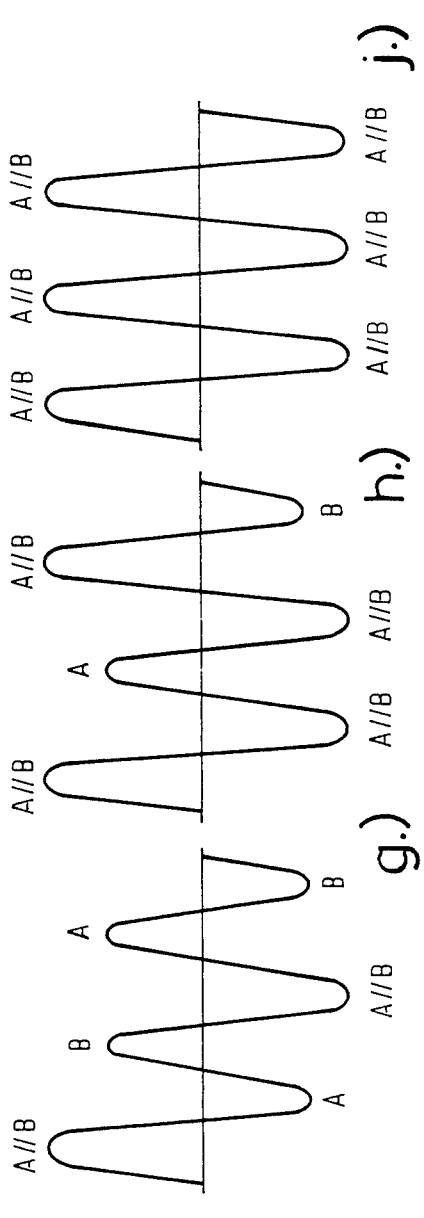
Figure 2:
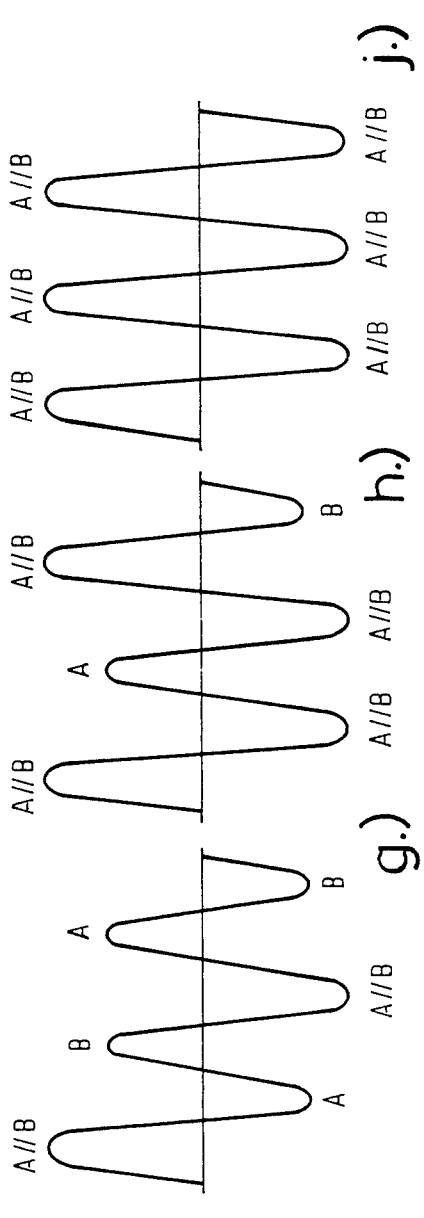
Figure 2:
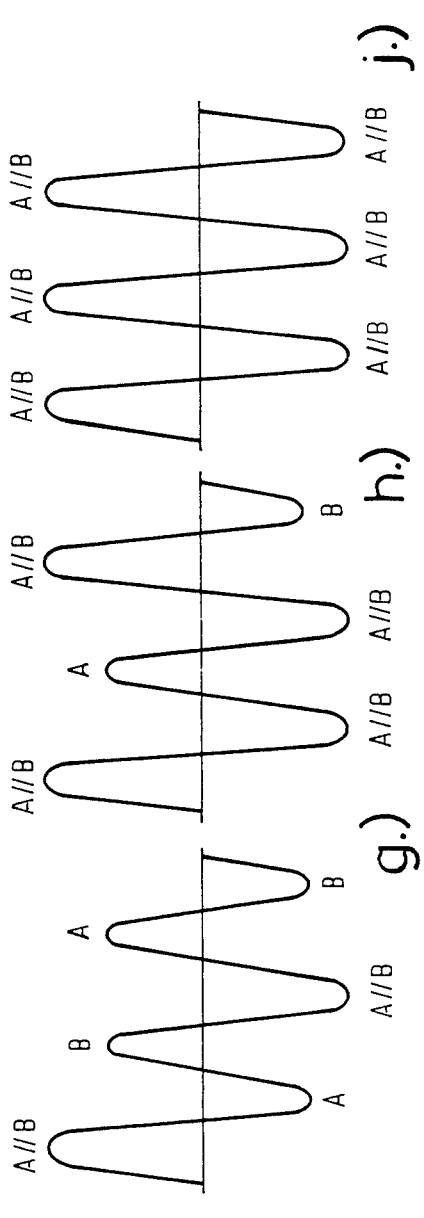
Figure 2:
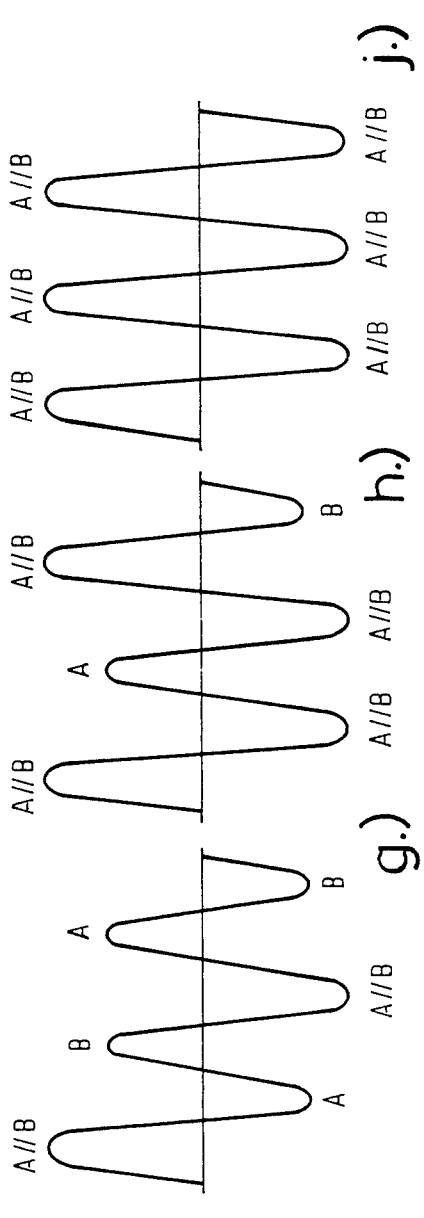

FIG. 2 shows now six switching cycles a to j in all, in which, for example, the loads A and B shown in FIG. 1 may be switched.

Each of these cycles has a length, each time, of six half waves. In the case of the cycle c, the loads A and B are connected in series to the mains, i.e. for all the six half waves of each cycle. This is the first main power stage. In the switching cycle f, the loads A and B are alternately switched individually to the mains, the load A being connected to the mains each time in the half waves 1, 3 and 5 and the load B being connected to the mains each time in the half waves 2, 4 and 6 of each cycle. In the switching cycle j, the loads A and B are each time connected in parallel to the mains for all the six half waves. The different amplitudes of the half waves in the switching cycles c, f and j are to indicate symbolically the power consumption of the three main power stages increasing in this order of succession.

In the switching cycle b, the first intermediate power stage is shown which, starting from the main power stage of the series arrangement of the loads A and B shown in the cycle c, is possible. In the switching cycle b of the first intermediate power stage, the power is switched off during the third and sixth half waves of the cycle because, in the case of the main power stage of the series arrangement of both loads, this is quasi the next lower main power stage, which is in this case zero. In the switching cycle a, starting from the switching cycle represented in c of the main power stage of the series arrangement of both loads, the second intermediate power stage is now represented in which, besides each third and sixth half wave, additionally during each second and fifth half wave of the cycle the power loads to the switched-off. In the switching cycle represented in a of the second intermediate power stage, the loads A and B are therefore connected in series arrangement to the mains only during the half waves 1 and 4.

Starting from the first main power stage, whose switching cycle is represented in FIG. 2c, the first intermediate power stage, whose switching cycle is represented in b, only has two thirds of the power consumption, while the second intermediate power stage represented in a only has one third of the power consumption.

In addition, for each of the two further main power stages (f and j) two intermediate power stages are provided. For the main power stage represented in FIG. 2 by the switching cycle f, in which both loads are alternately connected individually to the 200 V mains, there is a first intermediate power stage whose switching cycle is e, and a second intermediate power stage whose switching cycle is d.

The first intermediate power stage starting from the main power stage of the alternate connection of the loads shown in switching cycle e, switches during the third and sixth half waves to the next lower main power stage. Therefore, in this case to the main power stage consisting of the series arrangement of the loads A and B. Thus, in the second intermediate power stage of the switching cycle e, the load A is connected individually to the mains during the half waves 1 and 4, the load B is connected individually to the mains during the half waves 2 and 5 and the loads A and B are connected in series to the mains during the half waves 3 and 6. In the second intermediate power stage, which forms part of this main power stage and whose switching cycle is represented in FIG. 2d, during the half waves 2 and 5 loads A and B are now switched to the series arrangement of the two loads so that during the first half wave of this cycle the load A is connected individually to the mains, during the fourth half wave of this cycle the load B is individually connected to the mains and during the remaining half waves of the cycle the two loads are connected in series to the mains.

In FIG. 2j, the third main power stage is shown in which the loads A and B are connected in parallel to the mains. Also starting from this main power stage, again two intermediate power stages are provided, which are shown in FIGS. 2h and 2g. In 2h, the first intermediate power stage is shown in which during the third and sixth half waves of the cycle the loads are switched to the next lower main power stage so that, in this case, during these cycles the loads A and B are alternately switched on, which means in the present example that during the half wave 3 the load A is switched on individually and during the half wave 6 the load B is switched on individually. During the remaining half waves of this cycle, the loads A and B are connected in parallel to the mains. In the switching cycle g, the second intermediate power stage is shown, which is obtained by starting from the main power stage of the parallel arrangement of the loads. In this case, during the half waves 2 and 3 and 5 and 6 the loads A and B are alernately connected individually to the mains, while during the half waves 1 and 4 the loads A and B are connected in parallel. In the present case, the load A is connected individually to the mains during the half waves 2 and 5 and the load B is connected individually to the mains during the half waves 3 and 6.

In the embodiment shown in FIG. 2, the cycles of the two intermediate power stages are shown, which are obtained according to the method for each of the three main power stages. For the main power stage whose switching cycle is represented in c, the first intermediate power stage with its switching cycle b and the second intermediate power stage with its switching cycle a are obtained. For the main power stage represented by the switching cycle f, the first intermediate power stage with its switching cycle e and the second intermediate power stage with its switching cycle d are obtained. And for the main power stage represented in j the first intermediate power stage with its switching cycle h as well as the second intermediate power stage with its switching cycle g are obtained.

In the example shown in FIG. 2, six further intermediate power stages in all are provided along with the three main power stages. Thus, nine power stages having power consumptions increasing in alphabetic order of succession of their time cycles are shown in FIG. 2.

Moreover, further power stages can be provided between the nine power stages consisting of the three main power stages and the six intermediate power stages. This can be achieved by switching to and from between two adjacent power stages. For example, for forming a further power stage, the control unit 1 can first produce a first cycle of six half waves as shown in FIG. 2a (second intermediate power stage obtained starting from the main stage of the series arrangement of the two loads) and the power consumption can be switched off in five further cycles of six half waves. Subsequently, the switching cycle as shown in FIG. 2a is produced again and then the power consumption is switched off for five cycles.

When switchng on, the control unit 1 will first choose the switching cycle with the lowest power stage in order to keep the switching surge effect as small as possible. After the expiration of at least one cycle, the system is switched to the switching cycle with the next higher power consumption. This is continued until the preselected power stage is reached.

Figure 3:
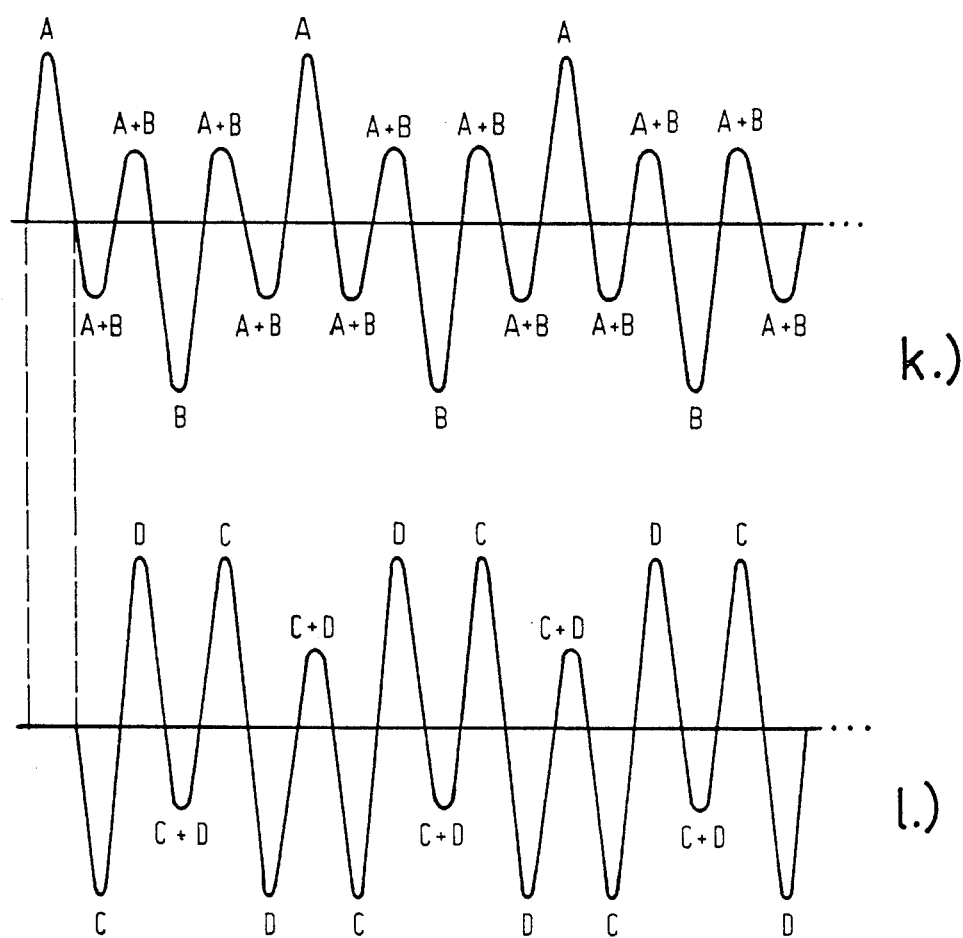

In FIG. 3, the switching cycles of two loads, not shown in the Figure, are shown one below the other. In the upper curve variation, the switching cycle of a load is indicated which comprises two subloads A and B. In the lower curve variation, the cycle of a load is indicated, which comprises two subloads C and D.

Each of these two loads may be connected, for example, in an arrangement shown in FIG. 1.

In the upper curve variation, the switching cycle of th subloads A and B is shown. The two subloads are switched to the second intermediate power stage, starting from the main power stage of the alternate connection of the two loads (cf FIG. 2d).

Since therefore the first load is switched to one of the possible second intermediate power stages, according to the method the second load comprising the subloads C and D is connected so as to be shifted in time with respect to the cycle of the first load by the duration of a half wave. The two subloads C and D are switched in the present example to the first intermediate powers stage, starting from the main power stage of the alternate connection of the loads to the mains (cf FIG. 2e). Because of the shift in time of the cycle of the second load, the load C is switched on with a delay of a half wave, that is to say during the second half wave of the loads A and B.

In this constellation, a comparatively uniform power consumption is obtained during operation of both main loads because the power peaks of the two loads do not coincide in time due to the shift of the swtching cycle of one of the loads. In the present example, the loads C and D consume comparatively high power if the loads A and B have a comparatively low power because of the series arrangement of the two loads.

What is claimed is:

1. A method of controlling the supply of power to electrical loads with a minimum of switching surges, which loads are each electrically subdivided into at least two equal subloads, which method comprises: connecting the subloads of each load arbitrarily in at least three main power stages in series arrangement alternately individually or in parallel arrangement to an A.C. mains, and for a finer power supply control switching the subloads to provide six intermediate power stages in which, starting from one of the three main power stages, in a continuously repeated cycle of six A.C. half waves in the first intermediate power stages during the third and sixth half waves in each cycle and in addition in the second intermediate power stages during the second and fifth half waves the subloads are switched each time to a next lower main stage, which for the series arrangement switches off the power consumption.

2. A method as claimed in claims 1, wherein for changing over from a first power stage to a second higher power stage, starting from the first power stage, each time switching on the next higher power stage successively and in increasing order for the duration of at least one cycle until the second power stage is reached.

3. A method as claimed in claim 2, characterized in that for changing over to a second lower power stage switchng the power stages in a corresponding manner with decreasing order of the power stages.

4. A method as claimed in any one of claim 1 to 3, characterized in that, when switching the subloads to an arbitrary power stage, first switching the subloads for the duration of at least one cycle to the lowest intermediate power stage.

5. A method as claimed in claim 4, characterized in that further intermediate gradations of power consumption are provided by switching to and fro between two adjacent power stages for the duration of whole multiples of a cycle.

6. A method as claimed in claim 4, characterized in that further power stages are provided below the smallest intermediate power stage by switching to and fro between said intermediate stage and the switched-off power consumption stage and for the duration of whole multiples of a cycle.

7. A method as claimed in claim 4 wherein for operation of two or more loads, each of whose subloads are switchable to intermediate power stages, the method further comprises shifting in time the cycle of the second load with respect to the cycle of the first load by the duration of the half waves if the first load is switched to one of the first intermediate power stages, and shifting its cycle by the duration of a half wave if said load is switched to one of the second intermediate power stages.

8. A method as claimed in any one of claims 1 to 3, characterized in that the subloads of a load are heating loads that have the same power consumption.

9. A cooking apparatus using light as a heat source comprising: at least one heating load which comprises two halogen lamps provided as subloads, a plurality of switches, means connecting said switches and lamps in a bridge circuit, a control unit which controls the switches such that the subloads can be connected over at least six A.C. half waves arbitrarily in three main power stages in series arrangement alternately individually or in parallel arrangement to an A.C. mains, characterized in that the control unit controls the switches in a manner such that, in addition, the subloads are switched arbitrarily in six intermediate power stages where, starting from one of the three main power stages the subloads are switched in a continuously repeated cycle of six A.C. half waves in the first intermediate power stages during the third and sixth half waves in each cycle and in the second intermediate power stages the subloads are additionally switched during the second and fifth half waves each time to a next lower main power stage, which for the series arrangement switches off the power to the sub-loads.

10. A method as claimed in claim 1 which further comprises switching between two adjacent power stages for the duration of whole multiples of a cycle so as to provide further intermediate levels of power consumption in the electrical loads.

11. A method as claimed in claim 1 which further comprises switching between an intermediate power stage and the switched-off power stage for the duration of whole multiples of a cycle thereby to provide further power stages below the smallest intermediate power stage.

12. A method as claimed in claim 1 adapted for operation of at least two loads each having subloads switchable to intermediate power stages, wherein the method further comprises shifting in time the cycle of the second load with respect to the cycle of the first load by the duration of the half waves if the first load is switched to one of the first intermediate power stages, and shifting its cycle by the duration of a half wave if said load is switched to one of the second intermediate power stages.

13. Apparatus for controlling the supply of power to at least one electric load with a minimum of switching surges, said at least one load comprising two subloads, comprising:
a plurality of semiconductor controlled switching devices,
a pair of input terminals for connection to a source of A.C. power,
means connecting said switching devices and said two subloads in a bridge circuit to said pair of input terminals, and
a control circuit coupled to control electrodes of said switching devices to control the operation thereof in the following manner;
the subloads are connected over six A.C. half waves of the A.C. power source arbitrarily in three main power stages comprising a first main power stage in which the two subloads are connected in series to the input terminals, a second main power stage in which the two subloads are alternately connected individually to the input terminals, and a third main power stage in which the two subloads are connected in parallel to the input terminals, and
wherein the control circuit further controls the operation of the switching devices in the following manner;
starting from one of said three main power stages, the subloads are switched over said six A.C. half waves arbitrarily in six intermediate power stages such that the subloads are switched in a repetitive cycle of six A.C. half waves in first intermediate power stages during the third and sixth half waves in each cycle and the subloads are switched in the second intermediate power stages during the second and fifth half waves in each cycle, the subloads being switchable from the second intermediate power stage to a next lower main power stage.

14. Apparatus as claimed in claim 13 wherein the control circuit switches the subloads in the first intermediate power stage of the first main power stage so that power to the two subloads is switched off during said third and sixth half waves and during the second intermediate power stage of the first main power stage power to the two subloads is switched off during the second, third, fifth and sixth half waves.

15. Apparatus as claimed in claim 14 wherein the control circuit switches the two subloads from the second intermediate power stage of the first main power stage to a next lower main power stage by switching off the subloads in each half wave of a cycle, i.e. during the first through the sixth half waves.

16. Apparatus as claimed in claim 13 wherein the control circuit switches the subloads in the first intermediate power stage of the second main power stage so that power to the two subloads is switched to the two subloads in series circuit during the third and sixth half waves of each cycle.

17. Apparatus as claimed in claim 13 wherein the control circuit switches the subloads in the second intermediate power stage of the second main power stage so that power to the two subloads is switched to the two subloads in series circuit during the second, third, fifth and sixth half waves of each cycle.

18. Apparatus as claimed in claim 13 wherein the control circuit switches the subloads in the first intermediate power stage of the third main power stage so that power for the two subloads is switched to one subload individually during the third half wave and to the other subload individually during the sixth half wave of each cycle.

19. Apparatus as claimed in claim 13 wherein the control circuit switches the subloads in the second intermediate power stage of the third main power stage so that power for the two subloads is switched to one subload individually during the second and fifth half waves and to the other subload individually during the third and sixth half waves.

20. Apparatus as claimed in claim 13 wherein in order to switch the subloads to an arbitrary one of said power stages, the control circuit first switches the subloads to the lowest intermediate power stage for a period of one cycle of six half waves.

21. Apparatus as claimed in claim 13 wherein in order to switch the subloads from a lower power stage to a higher power stage, the control circuit switches the subloads in steps that include at least one intermediate power stage between said lower and higher power stages.

22. Apparatus as claimed in claim 13 wherein said bridge circuit comprises a first branch including one subload in series with a first switching device and a second branch including a second switching device in series with the other subload, and a third switching device connected between a junction of the one subload and the first switching device and a junction of the second switching device and the other subload.

* * * * *